(12) United States Patent
Banerjee et al.

(10) Patent No.: US 7,138,686 B1
(45) Date of Patent: Nov. 21, 2006

(54) INTEGRATED CIRCUIT WITH IMPROVED SIGNAL NOISE ISOLATION AND METHOD FOR IMPROVING SIGNAL NOISE ISOLATION

(75) Inventors: Suman K. Banerjee, Chandler, AZ (US); Enrique Ferrer, Miami, FL (US); Olin L. Hartin, Chandler, AZ (US); Radu M. Secareanu, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/142,433

(22) Filed: May 31, 2005

(51) Int. Cl.
*H01L 29/76* (2006.01)
(52) U.S. Cl. .................. 257/371; 257/503; 257/544
(58) Field of Classification Search ............ 257/371, 257/372, 503, 544, 546
See application file for complete search history.

(56) References Cited

U.S. PATENT DOCUMENTS

| | | | |
|---|---|---|---|
| 5,773,856 A * | 6/1998 | Bearden et al. ............. 257/207 |
| 6,762,439 B1 | 7/2004 | Chen et al. |
| 6,801,416 B1 | 10/2004 | Hatzilambrou et al. |
| 6,891,207 B1 * | 5/2005 | Pequignot et al. .......... 257/173 |
| 7,038,292 B1 * | 5/2006 | Hsu ........................... 257/510 |
| 2002/0181177 A1 | 12/2002 | Ker et al. |
| 2003/0085432 A1 | 5/2003 | Du et al. |
| 2004/0099878 A1 | 5/2004 | Huang et al. |
| 2004/0164354 A1 | 8/2004 | Mergens et al. |
| 2005/0224882 A1 * | 10/2005 | Chatty et al. ................ 257/355 |

* cited by examiner

*Primary Examiner*—T. N. Quach
(74) *Attorney, Agent, or Firm*—Ingrassia,Fisher &Lorenz

(57) ABSTRACT

A system-on chip (SOC) (100) and method of isolating noise in a SOC, including a plurality of noise sensitive circuit blocks (120, 220) and ESD protected pads (302, 304, 306, 308, 310, 312, and 314). A VDD isolation pad (302) is connected to an N well ring (124) of the first noise sensitive circuit (120) to collect noise from the substrate (110) and isolate the circuit from the P well region (112). A ground protected pad (304) is connected to an isolated P well (126) of a first noise sensitive circuit (120). The ground pad (304) collects noise from the isolated P well (126) and sends it to ground. A dedicated ground isolation pad (306) is connected to a P well ring (224) of a second noise sensitive circuit (220). The dedicated ground isolation pad (306) collects noise from the P well ring (224) and sends it to ground. The dedicated ground isolation pad (306) and the ground pad (304) collect noise that would normally propagate between the first and second noise sensitive circuits (120, 220) and additional circuits that share the same substrate (110).

20 Claims, 2 Drawing Sheets

US 7,138,686 B1

INTEGRATED CIRCUIT WITH IMPROVED SIGNAL NOISE ISOLATION AND METHOD FOR IMPROVING SIGNAL NOISE ISOLATION

FIELD OF THE INVENTION

This present invention generally relates to the field of integrated circuits and more particularly, to improving substrate noise isolation and crosstalk in system-on-chip (SOC) applications.

BACKGROUND OF THE INVENTION

Microelectronic chip integration technology has lead to recent improvements. In the past, electronic systems have required the use of multi-chip systems including many microchips and discrete components. However, as integrated circuit technology has advanced, systems-on-chip (SOCs) have become more popular. A single SOC may contain, for example, numerous digital and analog integrated circuit components, e.g. CPUs, memories, random logic, RF circuitry, etc. Circuits of the type described above (i.e. mixed signal circuits that integrate various digital and analog circuit blocks on an SOC) present certain challenges. For example, a signal in one circuit may disrupt a signal in an adjacent circuit. This undesirable electrical interaction may be referred to as noise and/or crosstalk that may occur due to inductive or capacitive coupling.

It is well known to provide SOCs with contact pads that are ESD (electrostatic discharge) protected. Unfortunately, in some cases, noise can propagate via the ESD protected pads through the substrate and hamper the performance of sensitive circuitry on the SOC.

Thus, it would be desirable to provide a method for improving substrate noise isolation between ESD protected pads, circuit biasing lines and the SOC circuitry. Furthermore, other desirable features and characteristics of the present invention will become apparent from the subsequent detailed description of the invention and the appended claims, taken in conjunction with the accompanying drawings and this background of the invention.

BRIEF DESCRIPTION OF DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description.

One embodiment of the present invention provides a method for minimizing substrate crosstalk between electrostatic discharge (ESD) protected pads, associated with circuit supply and ground lines, and a system-on-chip in a SOC system. An improved ESD protected pad design and structure that accomplishes that goal may apply to SOC designs that include RF, analog, and digital circuits where signal isolation is a major design criterion.

Figure 1:
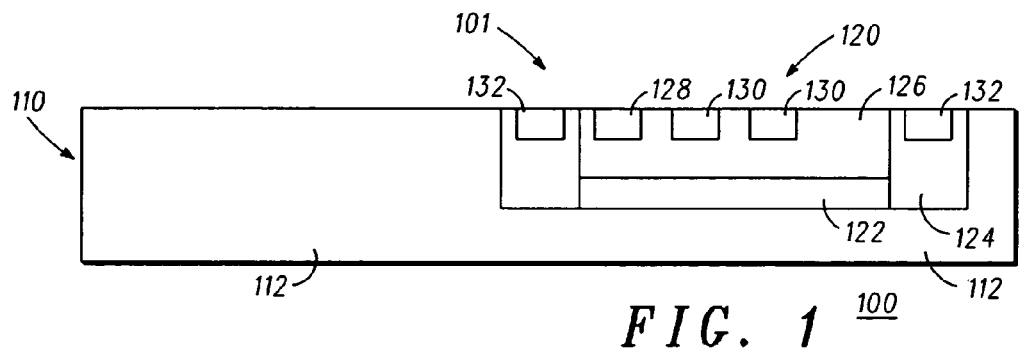
FIGS. 1–3 are cross sectional views of a system-on-chip including circuit biasing lines and connectivity and method steps for its manufacture, both in accordance with an embodiment of the present invention.
Figure 2:
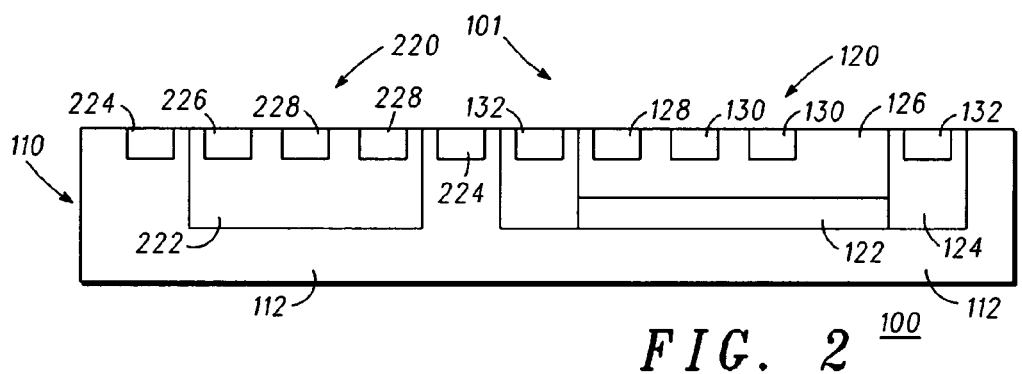
Figure 3:
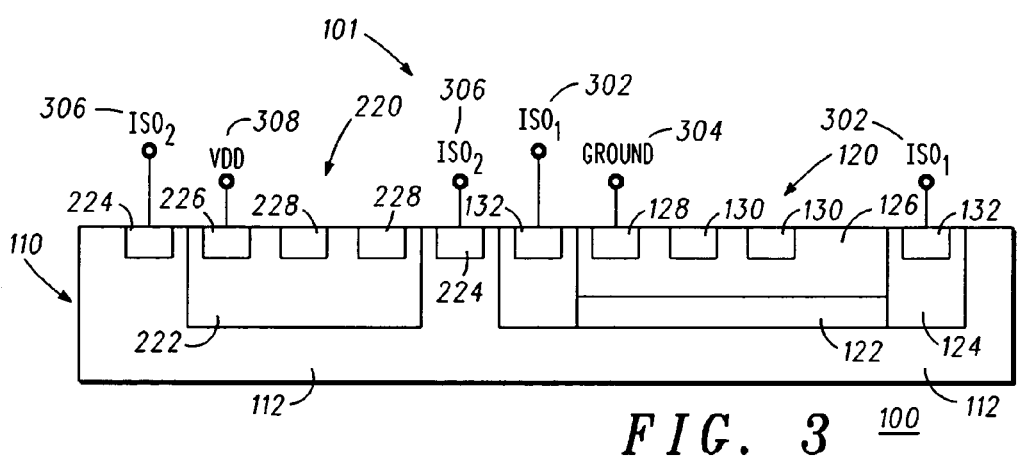

FIGS. 1–3 are cross-sectional views of a portion of a system-on-chip 100, including a mixed signal circuit, comprised of a NMOS device and a PMOS device, that together form a transceiver 101, as well as ESD protected pads. FIGS. 1–3 illustrate method steps for manufacturing and connecting the ESD protected pads to such a system-on-chip 100 in accordance with one embodiment of the invention. The resultant system-on-chip 100 and novel connectivity provides a method of minimizing substrate crosstalk between the ESD protected pads, the associated circuit biasing lines and system-on-chip 100.

As illustrated in FIG. 1, the manufacture of transceiver 101 in accordance with an embodiment of the invention begins with providing a semiconductor substrate 110. It should be understood that various steps in the manufacture of a transceiver device are well known and so, in the interest of brevity, many conventional steps will only be mentioned briefly herein or will be omitted entirely without providing the well-known process details. Semiconductor substrate 110 is preferably a silicon substrate and is intended to encompass the relatively pure silicon materials typically used in the semiconductor industry, silicon-on-insulator, as well as silicon add-mixed with other elements such as germanium and the like. Gallium arsenide substrates may also be considered in specific instances where noise isolation is a concern. Semiconductor substrate 110 is shown entirely comprising a P well region 112, but may be formed in the bulk of the larger semiconductor substrate or the entire semiconductor substrate 110 may be lightly doped P-type. P well region 112 is preferably doped to a concentration of between $\sim 1 \times 10^{14}/cm^3$ and $\sim 5 \times 10^{17}/cm^3$.

To form a first noise sensitive circuit, or NMOS device, 120 of system-on-chip 100, a deep N well region 122 is formed in P well region 112. Deep N well region 122 is formed by ion implantation and diffusion. The implantation process introduces the n-doped material into P well region 112. A subsequent diffusion (thermal anneal) step is necessary to activate the dopant atoms thereby forming deep N well region 122. Deep N well region 122 preferably has a doping concentration of between $\sim \times 10^{14}/cm^3$ and $\sim 1 \times 10^{18}/cm^3$ and a depth of between about 10,000 Angstroms (1 micron) and 25,000 Angstroms (2.5 microns). Next, an N well ring 124 is implanted in a similar manner. N well ring 124 preferably has a depth of approximately 16000 Angstroms (1.6 microns). N well ring 124 preferably has a doping concentration of between $\sim 1 \times 10^4/cm^3$, near the junction of N well ring 124 and P well region 112, and $\sim 5 \times 10^{17}/cm^3$ at a peak doping concentration near the surface of substrate 110. The doping profile of N well ring 124 extends from a surface of the wafer to a depth of $\sim 1.6$ microns, although this depth will vary with implant conditions and technology. Deep N well region 122 and N well ring 124 together create an isolated P well structure (IPW) 126 within P well region 112.

A $P^+$ source/drain contact (PSD) region 128 is next implanted in the surface of isolated P well structure 126 and an $N^+$ source/drain contact (NSD) region 130 is implanted into the surface of isolated P well structure 126 to form NMOS device 120 of the present invention. $P^+$ source/drain contact (PSD) region 128 and N⁺ source/drain contact (NSD) region 130 are formed, for example, using ion implant processes. During normal operation, P⁺ source/drain contact (PSD) region 128 is tied to the lowest voltage potential. P⁺ source/drain contact (PSD) region 128 is completely contained within isolated P well structure 126 as shown so that it is electrically isolated from P well region 112. P+ source/drain contact (PSD) region 128 preferably has a doping concentration of between about $\sim 5 \times 10^{17}/\text{cm}^3$ where region 128 merges with isolated P well structure 126 and $\sim 2 \times 10^{20}/\text{cm}^3$ at a peak doping concentration at the surface of substrate 110. P⁺ source/drain contact (PSD) region 128 extends from the surface of the wafer to a depth of approximately 3000 Angstroms (0.3 microns). The depth of P⁺ source/drain contact (PSD) region 128 will vary with implant conditions and technology.

N⁺ source/drain contact (NSD) region 130 is implanted in the surface of isolated P well structure 126 in the form of interdigitated fingers. An N-P junction is formed by N⁺ source/drain contact (NSD) region 130 and isolated P well structure 126 and defines the source and drain of NMOS device 120 of the present invention. N well ring 124 includes an N⁺ contact region 132 that provides ohmic contact to N well ring 124. Isolated P well structure 126 functions to isolate NMOS device 120 implemented in isolated P well structure 126 from circuits that are implemented outside isolated P well structure 126. Isolated P well structure 126 picks up the noise from NMOS device 120 and sends it to a ground pad (discussed below) via P⁺ source/drain contact (PSD) region 128, thereby minimizing the noise transferred from NMOS device 120 to substrate 110 and vice-versa. Deep N well region 122 has a low sheet resistance. However, due to the actual size (~100 micron×~100 micron) of deep N well region 122 the resistance can be high. Accordingly, connectivity for N well ring 124 and isolated P well structure 126 are formed as described herein.

FIG. 2 illustrates fabrication of a second noise sensitive circuit 220 formed as a part of transceiver 101. Second noise sensitive circuit 220 is formed as a PMOS device. To form PMOS device 220 of transceiver 101, an N well region 222 is next formed into P well region 112. N well region 222 is formed by ion implantation but may also be introduced by diffusion. P well region 112 further has formed therein a P⁺ source/drain (PSD) ring 224 for connecting P well region 112 to a ground isolation pad (GND ISO) (described herein). P⁺ source/drain (PSD) ring 224 provides an ohmic contact to P well region 112. An N⁺ source/drain contact (NSD) region 226 and a plurality of P+ source/drain contact (PSD) regions 228 are formed in N well region 222. P⁺ source/drain (PSD) ring 224, N well region 222, N⁺ source/drain contact (NSD) region 226 and P⁺ source/drain contact (PSD) regions 228 are all formed using, for example, ion implantation processes. More specifically, P⁺ source/drain contact (PSD) regions 228 are implanted in the surface of N well 222 in the form of interdigitated fingers. A P-N junction is formed by P⁺ source/drain contact (PSD) regions 228 and N well region 222, and defines the source and drain of PMOS device 220 of the present invention. Similar to the fabrication of NMOS device 120, various steps in the manufacture of PMOS device 220 are well known and so, in the interest of brevity, many conventional steps have only been mentioned briefly herein or have been omitted entirely without providing the well-known process details.

FIG. 3 illustrates schematically the method for connecting first noise sensitive circuit 120 and second noise sensitive circuit 220 to a plurality of ESD protected pads to provide improved signal isolation. As will be discussed herein, a novel connection scheme is disclosed further improve signal isolation. As illustrated, the method provides a novel mixed signal circuit device connectivity; thereby providing improved signal isolation of noise generated by devices 120 and 220 as well as noise generated by additional devices sharing substrate 110. N⁺ contact region 132 is connected to a first dedicated isolation (ISO₁) pad 302 (described herein) for isolating NMOS device 120. P⁺ source/drain contact (PSD) region 128 of NMOS device 120 is connected to a ground (GND) ESD protected pad 304. During normal operation, isolated P well structure 126 is therefore tied to the lowest voltage potential. The unique connectivity of NMOS device 120 in the form of connecting isolated P well structure 126 to ground pad 304 that is formed as a separate ESD protected pad, and N⁺ contact region 132 to a first dedicated isolation pad 302, provides improved noise isolation of NMOS device 120 during operation. P⁺ source/drain (PSD) ring 224 of PMOS device 220 is connected to a second dedicated isolation (ISO₂) pad 306 and N⁺ source/drain contact (NSD) region 226 is connected to a VDD pad 308. The unique connectivity of PMOS device 220 in the form of connecting P+ source/drain (PSD) ring 224 to second dedicated ISO pad 306, formed as a separate ESD protected pad, and connecting N⁺ source/drain contact (NSD) region 226 to VDD pad 308, provides improved noise isolation of PMOS device 220 during operation.

Figure 4:
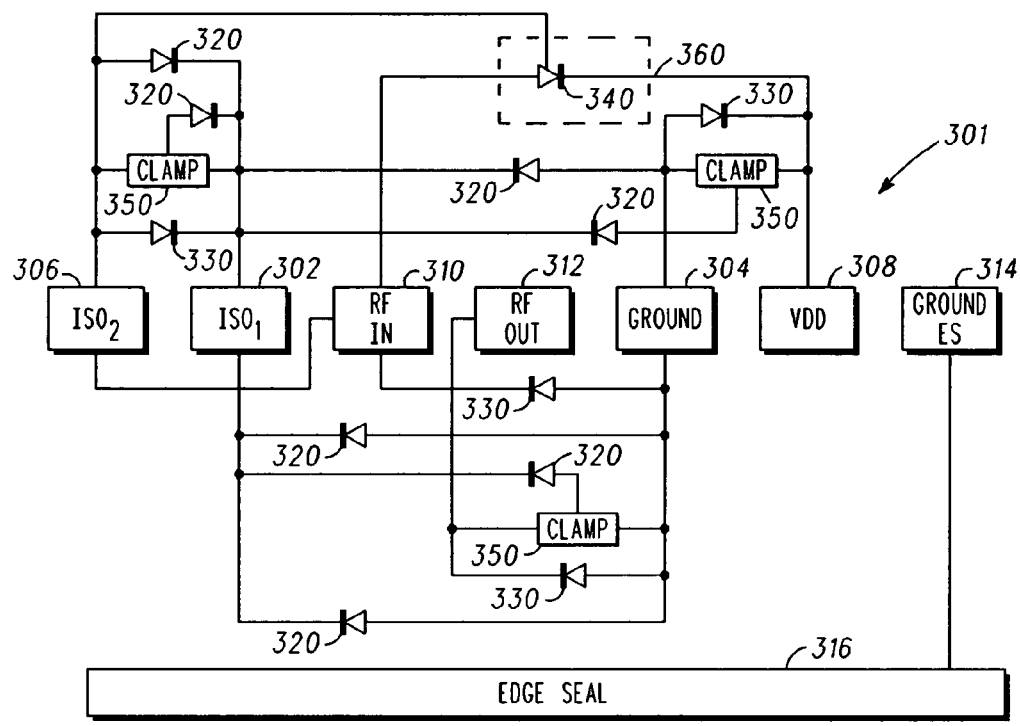
FIG. 4 is a schematic of an ESD protected pad structure in accordance with an embodiment of the present invention.

FIG. 4 is a schematic view of a portion of a system-on-chip (SOC) 300, illustrating a method for improving noise isolation in a noise sensitive circuit including ESD protected pads and a novel ESD protected pad connectivity structure 301 for a mixed signal circuit, such as transceiver 101 (FIG. 3). SOC structure 301 includes in this embodiment, ESD protected pads referenced 302, 304, 306, 308, 310, 312, and 314. More specifically, structure 301 includes first dedicated isolation (ISO₁) pad 302, second dedicated isolation (ISO₂) pad 306, an RF input (RF IN) pad 310, an RF output (RF OUT) pad 312, ground (GND) pad 304 (generally a ground signal pad), and VDD pad 308 (generally a VDD signal pad). Second dedicated isolation (ISO₂) pad 306, also known as a dedicated ground isolation pad, is connected to a P⁺ source/drain ring of a mixed signal circuit, such as P⁺ source/drain (PSD) ring 224 (FIG. 3) of transceiver 101. Ground pad 304 provides ground contact and signal isolation of at least one circuit formed as a part of system-on-chip 300. First dedicated isolation (ISO₁) pad 302, also known as a dedicated a VDD isolation pad, is connected to an N well of a device, such as N well ring 124 (FIG. 3) of an isolated P well 126 of transceiver 101 (FIG. 3). Dedicated VDD isolation (ISO₁) pad 302 provides signal isolation of the at least one circuit formed as a part of system-on-chip 300. RF IN pad 310 provides an input signal to an RF mixed signal circuit (not shown) of system-on-chip 300. RF OUT pad 312 provides an output signal to an RF mixed signal circuit of the system-on-chip 300. Ground pad 304 is connected to a P⁺ source/drain contact region formed in an isolated P well, such as P⁺ source/drain contact (PSD) region 128 (FIG. 3). Ground pad 304 provides a ground connection to at least one circuit of the system-on-chip 300. VDD pad 308 is connected to an N+contact region (NSD) formed in an N well structure, such as N⁺ source/drain contact (NSD) region 226 (FIG. 3). VDD pad 308 provides signal connection to at least one circuit of the system-on-chip 300.

Dedicated ground isolation pad 306 and first dedicated isolation (ISO₁) pad 302 are connected to be kept as noise-free as possible. Signal noise injected at second isolation (ISO₂) pad 306 and first dedicated isolation (ISO₁) pad 302 are the most significant noise injection mechanisms. During operation of system-on-chip 300, dedicated ground isolation (ISO$_2$) pad 306 and dedicated VDD isolation (ISO$_1$) pad 302 are connected to a clean ground (or reference potential) and supply to provide for the collection of noise in the vicinity of the ESD devices associated with the sensitive circuits that they are connected thereto.

Noise coupled via the ESD protected pads can propagate through the substrate in a system-on-chip. One of the main sources of noise in the ESD protected pads is due to the ESD diodes. Typically, there are two diodes located on either side of an ESD protected pad, an N-to-P diode and a P-to-N diode (described below). The N-to-P diode consists of an N+ doped region in a P well. The noise coupled via the N-to-P diode is directly injected into the substrate through the P well. This can be prevented by enclosing the N-to-P diode within an isolated P well structure as described with regard to FIG. 1. Further noise isolation is achieved through the connectivity of the isolated P well structure. The N-to-P diode can couple noise into as well as out of the substrate. For example, the N-to-P diode in an ESD protected pad connected to a digital circuit will couple digital clock noise. To isolate the noise, the noise needs to be prevented from reaching the substrate. On the other hand, the N-to-P diode in an ESD protected pad that is connected to a noise sensitive circuit will pick up the noise from the substrate that is undesirable. Therefore, the isolated P well helps in preventing both noise transfer mechanisms. The P-to-N diode is enclosed in an N well. To achieve comparable noise isolation for the P-to-N diode with the isolation achieved for the N-to-P diode enclosed in an isolated P well according to the present invention, the N well of the P-to-N diode is surrounded by a P$^+$ source/drain ring as previously described.

The method of improving substrate noise isolation using a novel ESD protected pad connectivity structure 301 further includes the integration of a plurality of ESD diodes 320 and clamps 330 (and associated trigger circuits) in the ESD protection device. Clamps 330 comprise circuits that have MOSFET structures (NMOS and PMOS) and provide for ESD protection when discharged by the trigger circuit. ESD diodes 320 and clamps 330 are isolated from the substrate for improved signal isolation. More specifically, in the embodiment illustrated in FIG. 4, a plurality of N-type ESD diodes 330 and NMOS clamps 350 are themselves placed in isolated P well (IPW) structures similar to NMOS device 120 in isolated P well 126 (FIG. 1). A P-type ESD diode 340 is surrounded by PSD ring 360 connected to dedicated ground isolation (ISO$_2$) pad 306. During operation, substrate noise isolation is achieved when dedicated ground isolation (ISO$_2$) pad 306 and ground pad 304 collect noise that would normally propagate through substrate 110 between circuit blocks, such as NMOS device 120, PMOS device 220, and surrounding circuits (not shown). Dedicated ground isolation (ISO$_2$) pad 306 collects noise from P$^+$ source/drain (PSD) ring 224 (FIG. 3) and sends it to ground via a pad that is fabricated separate and apart from ground pad 304. Ground pad 304 collects noise from isolated P well 126 and sends it to ground. Similarly, VDD pad 308 and dedicated VDD isolation (ISO$_1$) pad 302 provide further extraction of noise from the associated circuit blocks. In particular, dedicated VDD isolation (ISO$_1$) pad 302 extracts noise from deep N well region 122 thereby preventing noise from propagating through substrate 110. The novel ESD protected pad connectivity structure, including dedicated isolation pads 302 and 306, provides improved substrate noise in a mixed signal circuit, such as circuit 100 (FIG. 3).

Structure 301 further includes a dedicated ground edge seal (GND ES) pad 314. An edge seal 316 is formed about system-on-chip 300 and kept independently grounded through dedicated ground edge seal pad 314, a clean ground, in the vicinity of the at least one circuit of the system-on-chip 300. Edge Seal 316 is formed about a perimeter of system-on-chip 300 and therefore, can be near digital (noisy) circuit blocks, as well as noise sensitive circuit blocks. For optimum signal isolation, edge seal 316 is connected to dedicated ground edge seal pad 314 in the vicinity of the noise sensitive circuit blocks. It should be understood that although pad structure 301 illustrates specific pads being adjacent one another, alternative embodiments for the pad structure are anticipated by this disclosure. The ESD protected pads are formed about a perimeter of the system-on-chip in any manner that provides correct connectivity to the system-on-chip circuits as described herein.

Figure 5:
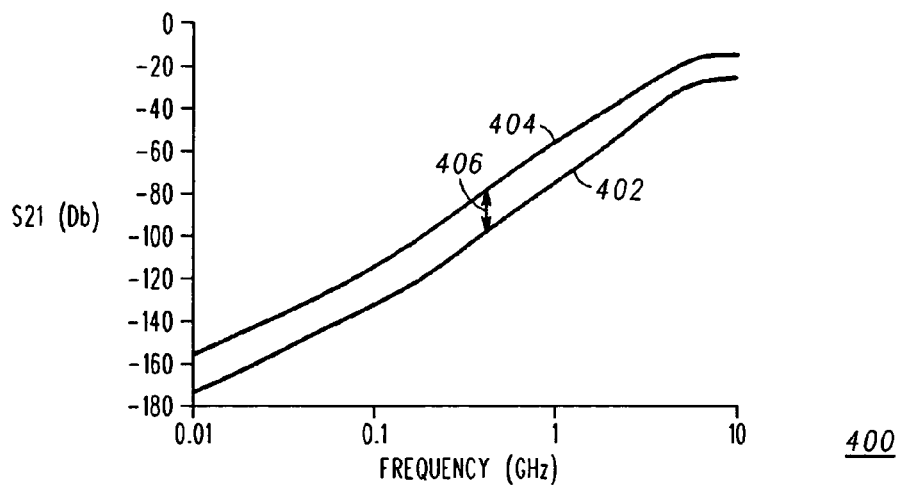
FIG. 5 is a graph representing signal isolation behavior in accordance with an embodiment of the present invention.

FIG. 5 is a graph 400 showing one example of S21 behavior for noise injected in an ESD protected pad and detected on-chip where the edge seal, similar to edge seal 316 (FIG. 4), is either floating or grounded. The bias on the edge seal that goes around the system-on-chip has an important effect on signal isolation. Depending on whether the edge is floating or grounded, signal isolation between the ESD protected pads and the circuits on the chip will vary. FIG. 5 illustrates comparatively a grounded edge seal, similar to edge seal 316 (FIG. 4), indicated by line 402 and a typical floating edge seal as indicated by line 404. As indicated by arrow 406, grounding the edge seal to a dedicated ground edge seal pad, similar to dedicated ground edge seal pad 314 (FIG. 4) improves signal isolation by ~20 dB over the entire 0.01 to 10 GHz frequency range.

The present invention thus provides a novel circuit connection scheme including ESD protected pads to improve signal isolation. Provided in one embodiment is a novel ESD protected pad connectivity structure including a dedicated VDD isolation (ISO$_2$) pad and a dedicated ground isolation (ISO$_1$) pad for noise signal reduction. Accordingly, one embodiment of the present invention provides a novel ESD diode structure, ESD protected pad design and connection scheme and method for minimizing substrate crosstalk. To improve noise isolation, modifications to the ESD protected pads, the biasing lines and the connectivity of diodes and clamps between different ESD protected pads have been optimized to specifically improve signal isolation between the pads and noise sensitive circuits formed as a part of the system on chip.

Accordingly, provided is an integrated circuit with improved signal noise isolation including a first noise sensitive circuit formed within an isolated P well defined by an N well ring and a deep N well region, and a second noise sensitive circuit formed within an N well region and having a P$^+$ source/drain ring formed thereabout, the electrostatic discharged (ESD) protection circuit comprising: a first dedicated isolation pad connected to the N well ring; and a second dedicated isolation pad connected to the P$^+$ source/drain ring. The first dedicated isolation pad is a dedicated VDD isolation pad. The second dedicated isolation pad is a dedicated ground isolation pad. The integrated circuit further including a P$^+$ source/drain contact region extending into the isolated P well and connected to a ground ESD protected pad and an N$^+$ source/drain contact region extending into the isolated P well. The N$^+$ source/drain contact region extends into the isolated P well is an interdigitated finger structure that forms the source and drain of an NMOS structure formed in the isolated P well. The integrated circuit further including an N$^+$ source drain contact region extending into the N well region and connected to a VDD pad and a P$^+$ source/drain contact region extending into the N well region. The P+ source/drain contact region extends into the N well region is an interdigitated finger structure that forms the source and drain of a PMOS structure. The integrated circuit is part of a system-on-chip.

Further provided is an integrated circuit with improved signal noise isolation including a first noise sensitive circuit formed in an isolated P well structure defined by an N well ring and a deep N well region and a second noise sensitive circuit having a P+ source/drain ring formed thereabout, the integrated circuit comprising: a first dedicated isolation pad connected to the N well ring of the isolated P well structure, the first dedicated isolation pad providing for signal isolation of the first noise sensitive circuit; a second dedicated isolation pad connected to the P+ source/drain ring, the second dedicated isolation pad providing for ground contact and signal isolation of the second noise sensitive circuit; an RF in pad providing an input signal to an RF circuit; a RF out pad providing for an output signal to the RF circuit; a ground pad providing for a ground connection to the first noise sensitive circuit; and a VDD pad providing for connection to the second noise sensitive circuit. The first dedicated isolation pad is a dedicated VDD isolation pad. The second dedicated isolation pad is a dedicated ground isolation pad. A dedicated ground edge seal pad connected to an edge seal formed about a perimeter of the integrated circuit, wherein the ground ES pad provides protection of the first and second noise sensitive circuits. A plurality of ESD diodes, each formed in an isolated P well and connected to the dedicated VDD isolation pad and the ground ESD protected pad.

Finally provided is a method of improving signal noise isolation in an integrated circuit comprising: providing a mixed-signal circuit including a plurality of noise sensitive circuit blocks formed in one of an N well and having a P+ source drain ring formed thereabout or an isolated P well defined by an N well ring and a deep N well region; connecting at least one of the noise sensitive circuit blocks formed in an N well to a VDD pad and connecting the P+ source drain ring formed thereabout the at least one noise sensitive circuit block to a dedicated ground isolation pad; and connecting at least one of the noise sensitive circuit blocks formed in an isolated P well to a ground pad and connecting the N well ring and the deep N well region to a dedicated VDD isolation pad; wherein the dedicated VDD isolation pad and the dedicated ground isolation pad provide for noise isolation in the mixed-signal circuit. The mixed signal circuit includes a plurality of noise sensitive circuits includes a first noise sensitive circuit and a second noise sensitive circuit, and the first and second noise sensitive circuits form a transceiver. The first noise sensitive circuit is an NMOS structure. The second noise sensitive circuit is a PMOS structure. The method further including the step of connecting an edge seal formed about a perimeter of the integrated circuit to a ground edge seal pad, wherein the ground edge seal pad provides protection of the plurality of noise sensitive circuits. The method further including the steps of providing a plurality of ESD diodes and clamps connected to the plurality of noise sensitive circuits. The method further including the step of providing at least one ESD diode formed in an isolated P well, wherein the at least one ESD diode is connected to the dedicated VDD isolation pad and the ground pad.

The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit of the forthcoming claims.

The invention claimed is:

1. An integrated circuit with improved signal noise isolation including a first noise sensitive circuit formed within an isolated P well defined by an N well ring and a deep N well region, and a second noise sensitive circuit formed within an N well region and having a P+ source/drain ring formed thereabout, the integrated circuit comprising:
   a first dedicated isolation pad connected to the N well ring; and
   a second dedicated isolation pad connected to the P+ source/drain ring.

2. An integrated circuit with improved signal noise isolation as claimed in claim 1 wherein the first dedicated isolation pad is a dedicated VDD isolation pad.

3. An integrated circuit with improved signal noise isolation as claimed in claim 1 wherein the second dedicated isolation pad is a dedicated ground isolation pad.

4. An integrated circuit with improved signal noise isolation as claimed in claim 1 further including a P+ source/drain contact region extending into the isolated P well and connected to a ground ESD protected pad and an N+ source/drain contact region extending into the isolated P well.

5. An integrated circuit with improved signal noise isolation as claimed in claim 4 wherein the N+ source/drain contact region extending into the isolated P well is an interdigitated finger structure that forms the source and drain of an NMOS structure formed in the isolated P well.

6. An integrated circuit with improved signal noise isolation as claimed in claim 1 further including an N+ source drain contact region extending into the N well region and connected to a VDD pad and a P+ source/drain contact region extending into the N well region.

7. An integrated circuit with improved signal noise isolation as claimed in claim 6 wherein the P+ source/drain contact region extending into the N well region is an interdigitated finger structure that forms the source and drain of a PMOS structure.

8. An integrated circuit with improved signal noise isolation as claimed in claim 6 wherein the integrated circuit is part of a system-on-chip.

9. An integrated circuit with improved signal noise isolation including a first noise sensitive circuit formed in an isolated P well structure defined by an N well ring and a deep N well region and a second noise sensitive circuit having a P+ source/drain ring formed thereabout, the integrated circuit comprising:
   a first dedicated isolation pad connected to the N well ring of the isolated P well structure, the first dedicated isolation pad providing for signal isolation of the first noise sensitive circuit;
   a second dedicated isolation pad connected to the P+ source/drain ring, the second dedicated isolation pad providing for ground contact and signal isolation of the second noise sensitive circuit;
   an RF in pad providing an input signal to an RF circuit;
   a RF out pad providing for an output signal to the RF circuit;
   a ground pad providing for a ground connection to the first noise sensitive circuit; and
   a VDD pad providing for connection to the second noise sensitive circuit.

10. An integrated circuit with improved signal noise isolation as claimed in claim 9 wherein the first dedicated isolation pad is a dedicated VDD isolation pad.

11. An integrated circuit with improved signal noise isolation as claimed in claim 9 wherein the second dedicated isolation pad is a dedicated ground isolation pad.

12. An integrated circuit with improved signal noise isolation as claimed in claim 9 further including a dedicated ground edge seal pad connected to an edge seal formed about a perimeter of the integrated circuit, wherein the ground ES pad provides protection of the first and second noise sensitive circuits.

13. An integrated circuit with improved signal noise isolation as claimed in claim 9 further including a plurality of ESD diodes, each formed in an isolated P well and connected to the dedicated VDD isolation pad and the ground ESD protected pad.

14. A method of improving signal noise isolation in an integrated circuit comprising:
    providing a mixed-signal circuit including a plurality of noise sensitive circuit blocks formed in one of an N well and having a P$^+$ source drain ring formed thereabout or an isolated P well defined by an N well ring and a deep N well region;
    connecting at least one of the noise sensitive circuit blocks formed in an N well to a VDD pad and connecting the P$^+$ source drain ring formed thereabout the at least one noise sensitive circuit block to a dedicated ground isolation pad; and
    connecting at least one of the noise sensitive circuit blocks formed in an isolated P well to a ground pad and connecting the N well ring and the deep N well region to a dedicated VDD isolation pad;
    wherein the dedicated VDD isolation pad and the dedicated ground isolation pad provide for noise isolation in the mixed-signal circuit.

15. A method of improving signal noise isolation in an integrated circuit as claimed in claim 14 wherein the mixed signal circuit including a plurality of noise sensitive circuits includes a first noise sensitive circuit and a second noise sensitive circuit, and the first and second noise sensitive circuits form a transceiver.

16. A method of improving signal noise isolation in an integrated circuit as claimed in claim 15 wherein the first noise sensitive circuit is an NMOS structure.

17. A method of improving signal noise isolation in an integrated circuit as claimed in claim 15 wherein the second noise sensitive circuit is a PMOS structure.

18. A method of improving signal noise isolation in an integrated circuit as claimed in claim 14 further including the step of connecting an edge seal formed about a perimeter of the integrated circuit to a ground edge seal pad, wherein the ground edge seal pad provides protection of the plurality of noise sensitive circuits.

19. A method of improving signal noise isolation in an integrated circuit as claimed in claim 14 further including the steps of providing a plurality of ESD diodes and clamps connected to the plurality of noise sensitive circuits.

20. A method of improving signal noise isolation in an integrated circuit as claimed in claim 19 further including the step of providing at least one ESD diode formed in an isolated P well, wherein the at least one ESD diode is connected to the dedicated VDD isolation pad and the ground pad.

* * * * *